United States Patent [19]

Kusumoto et al.

[11] Patent Number: 4,994,301

[45] Date of Patent: * Feb. 19, 1991

[54] ACVD (CHEMICAL VAPOR DEPOSITION) METHOD FOR SELECTIVELY DEPOSITING METAL ON A SUBSTRATE

[75] Inventors: Yoshiro Kusumoto; Kazuo Takakuwa; Tetsuya Ikuta; Akitoshi Suzuki; Izumi Nakayama, all of Kanagawa, Japan

[73] Assignee: Nihon Sinku Gijutsu Kabusiki Kaisha, Kanagawa, Japan

[*] Notice: The portion of the term of this patent subsequent to Jan. 24, 2006 has been disclaimed.

[21] Appl. No.: 68,644

[22] Filed: Jun. 30, 1987

[30] Foreign Application Priority Data

Jun. 30, 1986 [JP] Japan .................. 61-152921
Jul. 18, 1986 [JP] Japan .................. 61-170335
Jul. 19, 1986 [JP] Japan .................. 61-170280

[51] Int. Cl.$^5$ ................... B05D 3/06; B05D 5/12; C23C 16/00
[52] U.S. Cl. .................. 427/56.1; 427/124; 427/252; 427/255
[58] Field of Search ............. 427/55, 124, 255, 56.1, 427/252

[56] References Cited

U.S. PATENT DOCUMENTS

| | | | |
|---|---|---|---|
| 3,404,998 | 10/1968 | Pesetsky | 427/55 |
| 3,424,408 | 1/1969 | Michel et al. | 148/174 |
| 3,697,342 | 10/1972 | Cuomo et al. | 427/124 |
| 3,697,343 | 10/1972 | Cuomo et al. | 427/124 |
| 3,794,516 | 2/1974 | Engeler et al. | 427/255 |
| 3,826,699 | 7/1974 | Sawazaki et al. | 148/175 |
| 3,900,646 | 8/1975 | Clyde | 427/55 |
| 4,191,794 | 3/1980 | Shirland et al. | 427/250 |
| 4,215,156 | 7/1980 | Dalal et al. | 427/250 |
| 4,349,408 | 9/1982 | Tarng et al. | 427/253 |
| 4,401,689 | 8/1983 | Ban | 427/55 |
| 4,404,235 | 9/1983 | Tarng et al. | 427/124 |
| 4,430,364 | 2/1984 | Ito | 427/253 |
| 4,435,445 | 3/1984 | Allred et al. | 427/54.1 |
| 4,469,045 | 9/1984 | Chesworth | 427/255 |
| 4,504,526 | 3/1985 | Hofer et al. | 427/255 |
| 4,565,157 | 1/1986 | Brors et al. | 427/255.2 |
| 4,629,635 | 12/1986 | Brors | 427/255 |
| 4,650,698 | 3/1987 | Monja et al. | 427/255 |
| 4,741,928 | 5/1988 | Wilson et al. | 427/252 |
| 4,800,105 | 1/1989 | Nakayama et al. | 427/255 |
| 4,849,260 | 7/1989 | Kusumoto et al. | 427/255 |

Primary Examiner—Norman Morgenstern
Assistant Examiner—Marianne L. Padgett
Attorney, Agent, or Firm—Jones, Day, Reavis & Pogue

[57] ABSTRACT

A wafer, in which at least one via hole is made in an insulating film formed on the substrate, and a first metallic film is formed in the via hole is prepared. The wafer is held in a wafer holder in a reaction chamber under reduced pressure. $WF_6$ gas and $H_2$ gas are introduced into the chamber and light from a heating lamp is directed onto the wafer, such that a difference in temperature is created between the insulating film and the first metallic film such that a second metallic film of W is formed only on the first metallic film in the chemical vapor deposition process. The temperature difference is due to the differences of the adsorption ratios of infrared light of the insulating film, the substrate and the first metallic film. The $WF_6$ gas and $H_2$ gas are made to flow in flat or sheet form substantially parallel to the surface of the wafer, and in inernt gas, such as Ar, is made to flow toward the surface of the wafer to control the flow of $WF_6$ and $H_2$ gas.

24 Claims, 7 Drawing Sheets

Prior Art FIG.1
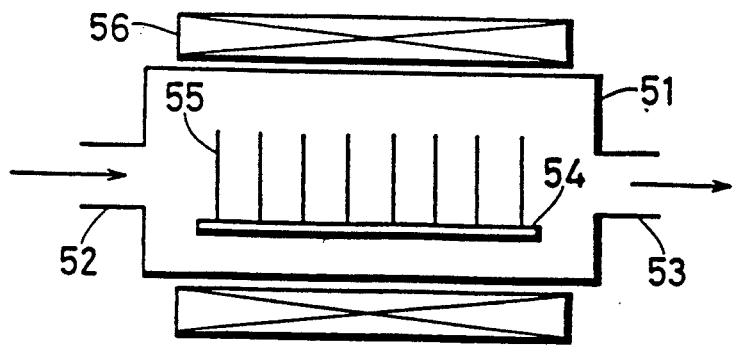
Prior Art FIG.2A  Prior Art FIG.2B
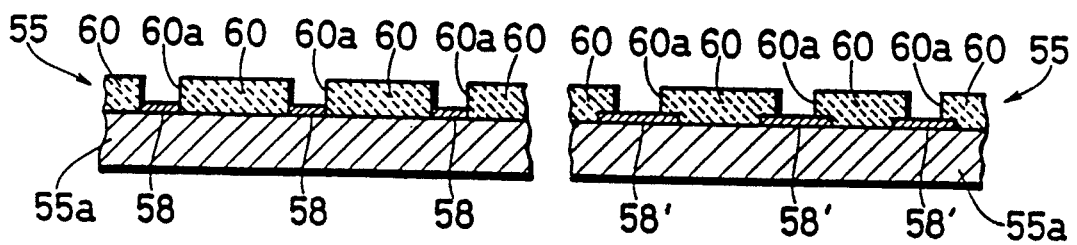
Prior Art FIG.3A  Prior Art FIG.3B
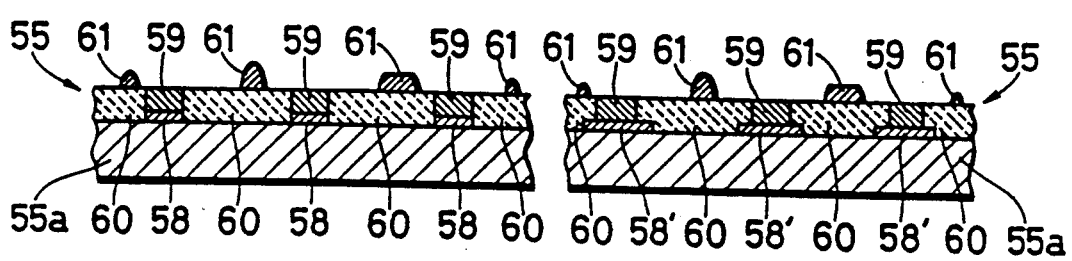
Prior Art FIG.4
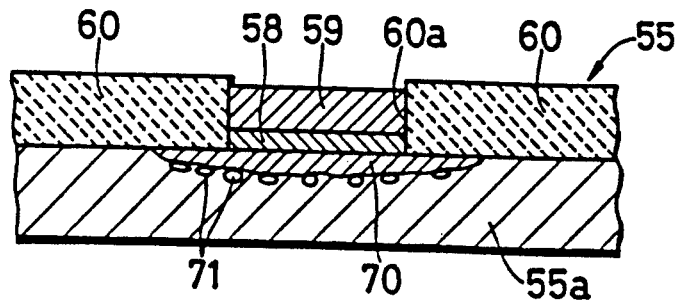

ACVD (CHEMICAL VAPOR DEPOSITION) METHOD FOR SELECTIVELY DEPOSITING METAL ON A SUBSTRATE

BACKGROUND OF THE INVENTION

1. Field of the Invention

This invention relates to a CVD (Chemical Vapour Deposition) method, and more particularly to a CVD method in which a second metallic film is formed on a first metallic film in a via hole or contact hole of an insulating film formed on a substrate of a wafer.

2. Description of the Prior Art

An apparatus which is used for a CVD method of prior art is shown in FIG. 1. Referring to FIG. 1, an inlet 52 and an outlet 53 are made respectively in the side walls of a horizontal reaction chamber 51 which is evacuated. A wafer holding plate 54 is horizontally arranged in the reaction chamber 51. Plural wafers 55 are vertically held at constant pitches by the wafer holding plate 54. An electrical heater 56 is arranged around the reaction chamber 51.

$WF_6$ as gas containing metallic element and $H_2$ as reduction gas are introduced into the reaction chamber 51 from the inlet 52, and they are exhausted outwards from the outlet 53. The electrical heater 56 heats the reaction chamber 51. The temperature of the inner wall of the reaction chamber 51 rises. The heat from the inner wall is transmitted through the reaction gases $WF_6$ and $H_2$ to the wafers 55. The wafers 55 are thus heated, and the reaction gases $WF_6$ and $H_2$ chemically react on the wafers 55. Metallic films are formed on the wafers 55.

FIGS. 2A and 2B show the details of the wafer 55. The wafer 55 has the construction of FIG. 2A or FIG. 2B. Referring to FIGS. 2A and 2B, an insulating film 60 of $SiO_2$ is formed on a substrate 55a of the wafer 55. Via holes or contact holes 60a are formed in the insulating film 60. A first metallic film 58 or 58' of W or Al or Aluminum alloy is formed in said via hole or contact hole 60a. It is inferred that the chemical reactions represented by the following formulas (1) and (2) are effected on the metallic film (surface) 58 or 58':

$$3H_2 \rightarrow 6H \quad (1)$$

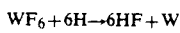

$$WF_6 + 6H \rightarrow 6HF + W \quad (2)$$

W films grow with time. Second metallic films 59 are formed on the first metallic films 58 in the via hole or contact hole 60a as shown in FIG. 3A and 3B.

Generally, the growing rate G of the W film is expressed by the following equation:

$$G = A[H_2]^{\frac{1}{2}} \exp(-Ea/kTm) \quad (3)$$

where A represents a positive constant, $[H_2]$ a hydrogen concentration, Ea activation energy, k Boltzmann's constant, and Tm the surface temperature of the growing metallic film.

In the above described CVD method of prior art, the surface temperature Tm of the first metallic film 58 or 58' in the via hole 60a and the surface temperature Ti of the insulating film 60 ar nearly equal to each other. As understood from the equation (3), the growing rate G of the W film increases with the surface temperature Tm. However, the surface temperature Ti increases with the surface temperature Tm, in the prior art CVD method. Accordingly, at high deposition temperature, the metallic films 58, 58' and 59 of W are formed not only in the via hole or contact hole 60a, but a metallic nucleation 61 are formed also on the insulating film 60, as shown in FIGS. 3A and 3B, since the above chemical reactions represented by the formulas (1) and (2) are effected both in the via hole or contact hole 60a and on the insulating film 60. That is disadvantageous.

FIG. 4 is an enlarged view of a part of the wafer 55 shown in FIG. 3B. In the growing process of the metallic film 59, metal W encroaches the interface between the Si substrate 55a and the insulating film 60. Thus, the encroachment 70 is formed. In some cases, voids 71 are formed in the substrate 55a.

These inventors inferred that the turbulent flow or natural convection in the vicinity of the wafer 55 promotes the formations of the encroachment 70 and voids 71, in the prior art CVD method. However, control parameters are only two internal parameters, which are pressure and flow rate of reaction gas. Accordingly, it is not possible to control the turbulent flow and natural convection from the outside, and the encroachment and voids cannot be suppressed. The metallic film formation of the prior art has some problems on the reproducibility, controllability and uniformity in the wide range of the pressure and flow rate.

Further in the prior art method, the reaction components are diffused into the whole space of the reaction chamber. They adhere to the inner walls and the inspection window. Such problems occur from that fact that dust particles are made, and they are mixed as impurities into the film.

Film formation at low temperature and low concentration is considered for suppressing the encroachment and voids. However, the growing rate becomes low, such as scores of angstroms Å/min. (Broadkent Metal. J. Electrochem. Soc. 131, (42)(1984); Blower. VMIC (1985)). For example, about two hours are required for filling a via hole or contact hole of 1 μm depth.

SUMMARY OF THE INVENTION

Accordingly, it is an object of this invention to provide a CVD method in which a second metallic film can be formed on a first metallic film in a via hole or contact hole of an insulating film on a substrate of a wafer with good quality.

Another object of this invention is to provide a CVD method in which a second metallic film can be formed on a first metallic film in a via or contact hole of an insulating film on a substrate of a wafer with good selective formation of said metallic film.

A further object of this invention is to provide a CVD method in which a second metallic film can be formed only on a first metallic films in a via hole or contact hole of an insulating film on a substrate of a wafer at a high rate.

A still further object of this invention is to provide a CVD method in which the encroachment and voids can be suppressed in the formation of the second metallic film onto the first metallic film in a via hole or contact hole of an insulating film on a wafer.

A still further object of this invention is to provide a CVD method in which dust particles are prevented from being made, and so the inner wall of the reaction chamber and the observation window are prevented from contamination.

In accordance with an aspect of this invention, a CVD (Chemical Vapour Deposition) method comprises: (A) the step of holding a wafer on a wafer holder in a reaction chamber to be put under a reduced pressure, at least one via hole or contact hole being made in an insulating film formed on a substrate of said wafer and a first metallic film being formed in said via hole or contact hole; and (B) the steps of introducing a gas containing metallic element and a reduction gas into said reaction chamber under the reduced pressure and throwing light of a heating lamp onto said wafer so that some temperature difference is made between said insulating film and said first metallic film, utilizing some differences of absorption ratios of said light among said insulating film, said substrate and said first metallic film, a chemical reaction is effected only on said first metallic film, and a second metallic film of said metal element is formed on said first metallic film even at high growth rate.

In accordance with another aspect of this invention, a CVD method comprises: (A) the step of holding a wafer on a wafer holder in a reaction chamber to be put under a reduced pressure, at least one via hole or contact hole being made in an insulating film formed on a substrate of said wafer and a first metallic film being formed in said via hole or contact hole; (B) the steps of introducing a gas containing metallic element and a reduction gas in flat or sheet form substantially parallel to the surface of said wafer into said reaction chamber under the reduced pressure introducing an inert gas or a second gas containing mainly inert gas towards the surface of said wafer and heating said wafer so that a second metallic film of said metal element is formed on said first metallic film.

The foregoing and other objects, features, and advantages of the present invention will be more readily understand upon consideration of the following detailed description of the preferred embodiments of the invention, taken in conjunction with the accompanying drawings.

BRIEF DESCRIPTION OF THE DRAWINGS

FIG. 1 is a schematic cross-sectional view of a CVD apparatus used for a prior art method;

FIG. 2A and 2B are enlarged cross-sectional views of a part of a wafer arranged in the CVD apparatus of FIG. 1, in which the wafer has the alternative construction of FIG. 2A or FIG. 2B;

FIG. 3A and 3B are enlarged, cross-sectional views of the part of the wafer for explaining a second metallic film formed on a first metallic film in a via hole of an insulating film of the wafer, in which the wafer has the alternative construction of FIG. 3A or FIG. 3B, FIG. 4 is a further enlarged cross-sectional view of a part of the wafer shown in FIG. 3A;

DESCRIPTION OF THE PREFERRED EMBODIMENTS

Figure 5:
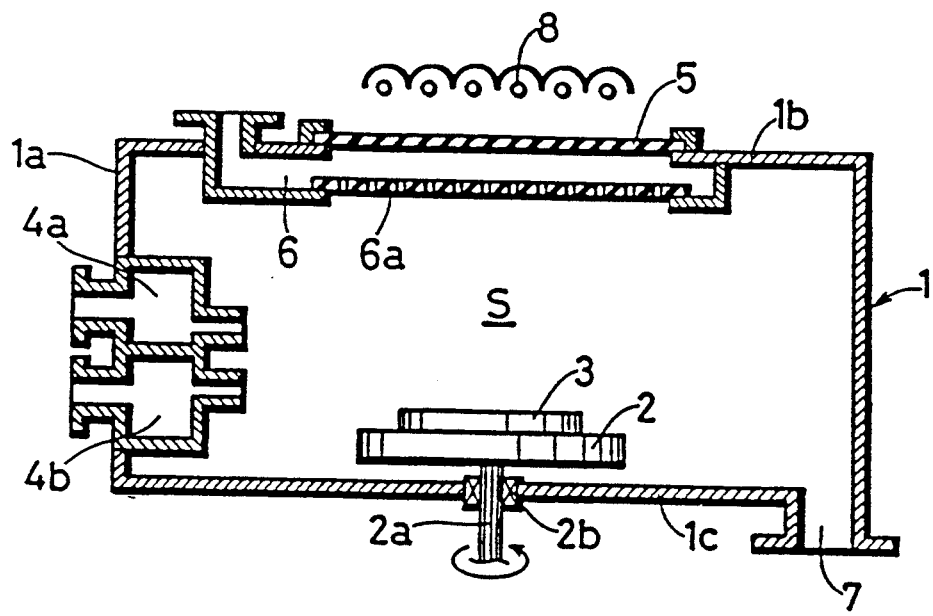
FIG. 5 is a schematic cross-sectional view of a CVD apparatus according to a first embodiment of this invention.

FIG. 5 is a schematic view of a CVD apparatus according to a first embodiment of this invention. Referring to FIG. 5, a wafer holder 2 is rotatably arranged in a pressure-reduced reaction chamber 1. A substrate or wafer 3 is held on the wafer holder 2. A shaft 2a is fixed to the wafer holder 2, and it is rotatably and fluid-tightly supported by a bearing 2b which is fixed to a bottom wall 1c of the reaction chamber 1.

Gas introducing portions 4a and 4b having slit-like openings respectively are arranged in one side wall 1a of the reaction chamber 1. $H_2$ as reduction gas is introduced into the reaction chamber 1 in flat or sheet form from the one gas introducing portion 4a. $WF_6$ as gas containing metallic element is introduced into the reaction chamber 1 in flat or sheet form from the other gas introducing portion 4b. The $H_2$ gas and $WF_6$ gas flow along the surface of the wafer 3.

A transparent quartz glass plate 5 and an inert gas introducing portion 6 are fixed on an upper wall 1b of the reaction chamber 1. A gas-spouting plate 6a of the inert gas introducing portion 6 is made of quartz glass, and transparent. Further, it has numerous small openings, and it is positioned directly under the transparent quartz glass plate 5. Ar gas as inert gas is spouted downwards into the reaction chamber 1 from the gas-spouting plate 6a. The stream direction of Ar gas is substantially perpendicular to the stream direction of the $H_2$ and $WF_6$ gas, so that the $H_2$ and $WF_6$ gas is prevented from diffusing upwards in the course of the stream.

An outlet portion 7 is formed in the bottom wall 1C of the reaction chamber 1. The $H_2$, $WF_6$ and Ar gas is exhausted through the outlet portion 7 outwards from the reaction chamber 1.

An infrared lamp 8 is arranged directly above the transparent quartz glass plate 5 outside of the reaction chamber 1. An infrared ray from the infrared lamp 8 is incident on the surface of the wafer 3 through the transparent quartz glass plate 5 and the gas-spouting plate 6a.

Next, a CVD method using the above described apparatus will be described with reference to FIG. 6A to FIG. 8C.

Figure 6A:
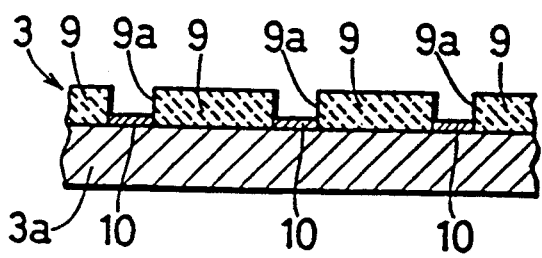
FIG. 6A and 6B are enlarged cross-sectional views of a part of a wafer arranged in the apparatus of FIG. 5, in which the wafer has the alternative construction of FIG. 6A or FIG. 6B.

First, the structure of the wafer 3 will be described with reference to FIG. 6A. Referring to FIG. 6A, an insulating film 9 of SiO₂ is deposited on a substrate 3a of Si (silicon), and via holes or contact holes 9a are formed in the insulating film 9. First metallic films 10 of W are formed in the via holes or contact hole 9a, the wafer 3 of FIG. 6A is held on the wafer holder 2 in the reaction chamber 1.

Figure 6B:
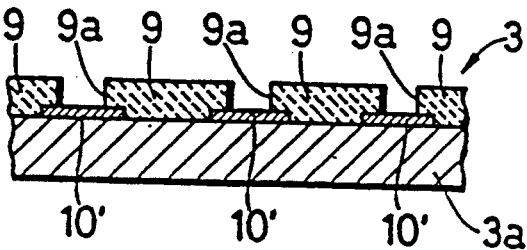

The wafer 3 may have alternatively the construction as shown in FIG. 6B. Referring to FIG. 6B, the insulating film 9 of SiO₂ is deposited on the substrate 3a of Si, and the via holes 9a are formed in the insulating film 9. First metallic films 10' of Al or Al alloy are formed in the via holes 9a.

H₂ gas as reduction gas and WF₆ gas as gas containing metallic element are introduced into the pressure-reduced reaction chamber 1 from the gas introducing portions 4a and 4b. The wafer holder 2 is rotated. Ar gas is spouted downwards from the gas-spouting plate 6a.

The infrared ray of the infrared lamp 8 is thrown onto the surface of the wafer 3 through the transparent quartz glass plate 5 and the transparent gas-spouting plate 6a. The wave length range of light components exhibiting the maximum intensity is 1.1 to 3 μm in the infrared ray of the infrared lamp 8.

The absorption rate of the substrate 3a of Si is little for the infrared ray components of longer than wave length 1.1 μm. That of the insulating film 9 of SiO₂ is little for the infrared ray components of shorter than the wave length 3 μm. However, that of the metallic film 10 of W is known to be larger than those of the substrate 3 of Si and insulating films 9, for the whole range of the infrared ray components of 1.1 to 3 μm. Accordingly the metallic films of W are heated more than the insulating film 9 of SiO₂, by the infrared lamp 8. There occurs some temperature difference between the metallic films 10 of W and the insulating film 9 of SiO₂.

Therefore, it is inferred that the following chemical reactions represented by the following formulas (4) and (5) are effected only on the surfaces of the metallic films 10 of W almost without W nucleation formation on the insulating film 9 of SiO₂:

$$3H_2 \rightarrow 6H \tag{4}$$

$$WF_6 + 6H \rightarrow 6HF + W \tag{5}$$

Figure 7A:
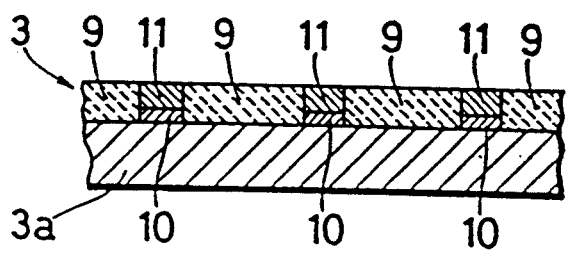
FIG. 7A and 7B are enlarged cross-sectional views of the part of the wafer for explaining a second metallic film formed on a first metallic film in a via hole or contact hole of an insulating film of the wafer, in which the wafer has the alternative constructions of FIG. 7A or FIG. 7B.
Figure 7B:
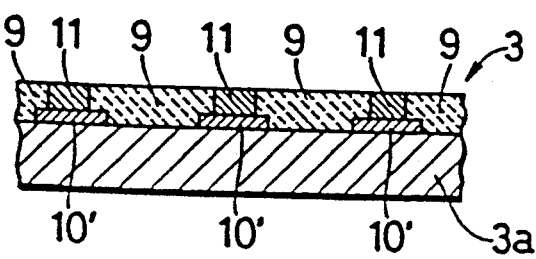

W films grow with time. As the result, second metallic films 11 of W are formed on the first metallic films 10 or 10' of W, as shown in FIG. 7A or FIG. 7B.

According to this embodiment, the above chemical reactions are effected only on the first metallic films 10, since the first metallic films 10 and the insulating film 9 of SiO₂ are heated with some temperature difference by the infrared lamp 8. Thus, the metallic films of W are formed only on the first metallic film 10 or 10' in the via holes or contact holes 9a of the insulating film 9. The growth rate of W film is further higher in this embodiment than the growth rate of W film in the prior art method.

Next, there will be described effects of the gas flows in the above embodiment.

Figure 8A:
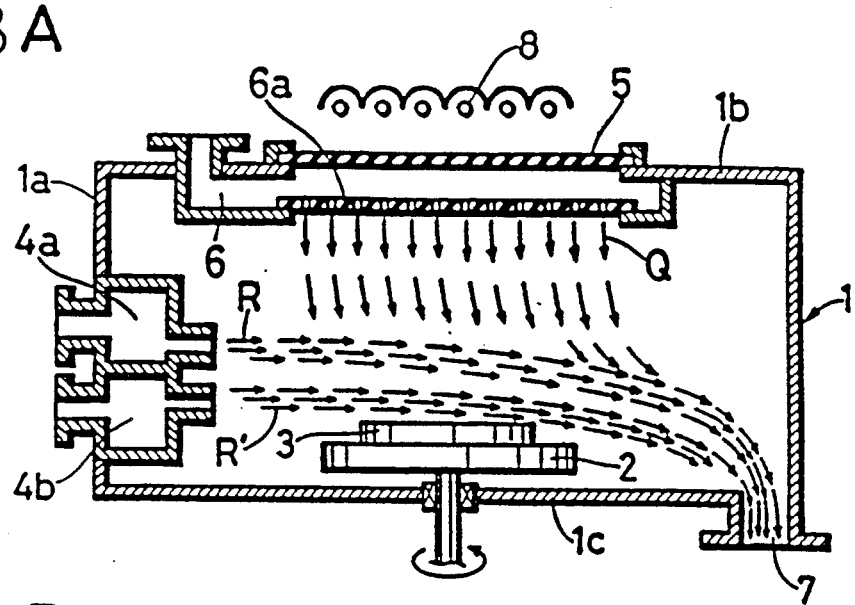
FIG. 8A to FIG. 8C are schematic cross-sectional views of the apparatus for explaining gas flow effects of the first embodiment.
Figure 8B:
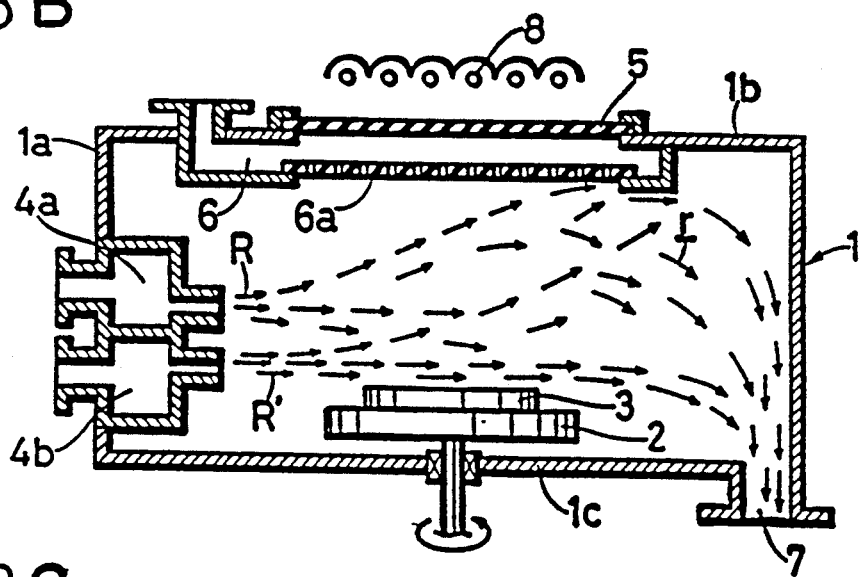
Figure 8C:
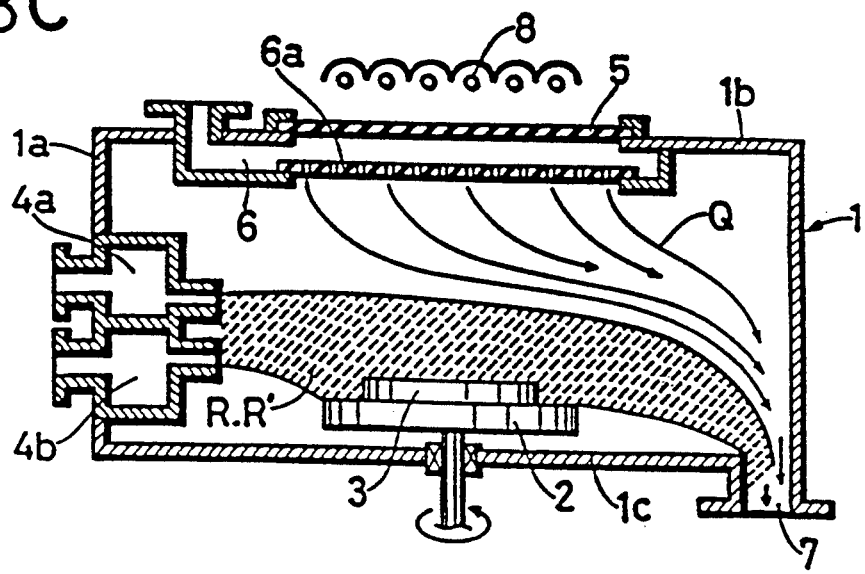

H₂ as reduction gas is two-dimensionally jetted into the space S of the reaction chamber 1, from the nozzle opening of the one gas introducing portion 4a and its gas flow is represented by a reference R in FIGS. 8A to FIG. 8C, while WF₆ as gas containing metallic element is two-dimensionally jetted into the space S of the reaction chamber 1, from the nozzle opening of the other gas introducing portion 4b, and its gas flow is represented by a reference R' in FIG. 8A to FIG. 8C. On the other hand, Ar as inert gas is jetted downwards from the inert gas spouting plate 6a of the inert gas introducing portion 6, and its gas flow is represented by a reference Q in FIG. 8A to FIG. 8C. The flow rates of the gases R, R' and Q can be controlled at the outside. For example, they are so controlled that the flow rate of the inert gas Q is three times as much as the flow rate of the reaction gases R and R'.

As understood from FIG. 8A, the flows of the reaction gases R, R' are limited to the vicinity of the wafer 3, and further they are put into laminar flow condition. It is inferred to cause the above fact that the inert gas flow Q suppresses the reaction gas flows R, R' from the above. Such a stabilizing operation is confirmed by a numerical simulation using computer, and by a visualizing experiment using a titanium tetra-chloride.

The flow of the reaction gases R, R' is macroscopically a limited laminar flow, as shown by the hatch in FIG. 8C. The flow of the inert gas Q decides the range of the limited laminar flow of the reaction gases R, R'. In other words, the shape, extent and range of the hatched portion can be controlled with the flow control of the inert gas Q.

FIG. 8B shows the case that no flow of the inert gas Q is introduced into the reaction chamber 1. As understood from FIG. 8B, the reaction gases R, R' diffuse widely, and turbulently flow in the space region r. In that case, the inner wall of the reaction chamber and the inspection window is contaminated with the turbulent flow of the reaction gases, as in the prior art method.

However, according to this embodiment the reaction gas flows R and R' are so stabilized and limited to the vicinity of the wafer 3 as to be shown in FIG. 8A or FIG. 8C. Accordingly, the inner wall of the reaction chamber and the inspection window can be prevented from contamination. The quality of the metal films 11 formed on the wafer 3 can be improved, and the dust particles can be reduced. When the second metal films 11 are formed on the first metal films 10 or 10', as shown in FIG. 7A or FIG. 7B, the encroachment 40 and voids 41 as shown in FIG. 4 can be almost prevented from growing under the first metal films 10 or insulating film 9 in contrast to the prior art. Accordingly, the yield rate of the semiconductor device using the wafer 3 can be improved.

Since the reaction gases R and R' are made laminar, the method according to this embodiment is superior in controllability and reproducibility. The thickness distribution of the second metallic film formed on the first metallic film 10 in the wafer 3, and the depth of the encroachment can be controlled with the flow rate of the inert gas Q.

Here, a theoretical ground for the effects of the gas flows according to this embodiment will be discussed.

There are some unclear points on the influence of the reaction gas flows on the encroachment. However, the following inference will be possible:

Because the silicon reduction reaction represented by the formula:

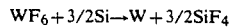
$$WF_6 + 3/2Si \rightarrow W + 3/2SiF_4$$

is effected also after the initial stage, at which time the first remarkable encroachment occurs. The silicon reduction reaction should not occur when the silicon substrate in the via hole or contact hole is covered with the metallic-film.

It is considered that the reaction gas is supplied into the wafer 3 through the gaps between the sides of the metallic films 10 or 10', 11 and the sides of the via holes or contact holes of the insulating film 9, and slight gaps among the numerous crystal grains of the metallic films 10 or 10' and 11. In order to promote the silicon reduction on the interface between the metallic film and the silicon substrate, the reaction product ($SiF_4$) should be effectively discharged into the space in the reaction chamber. When a turbulent flow region exists near the surface of the wafer, the reaction product is rapidly discharged and diffused outwards through the above-described gaps due to pumping operation of the turbulent diffusion. However, when the whole surface of the wafer is covered with the laminar flow, the reaction product is discharged outwards only by a molecular diffusion phenomenon. When the gaps are sufficiently narrow, the discharging speed is negligibly small in comparison with the discharging due to the turbulent diffusion. It will be understood from the above that the gas flow control in the vicinity of the surface of the wafer has much influence on the encroachment.

The comparison experiments were made under the same growth temperature, total pressure and partial pressure of the reaction gas in the cases that the reaction gases R and R' are made laminar by the inert gas flow Q and that the reaction gases R and R' are not made laminar. Tungsten hexafluoride, $WF_6$, and hydrogen, $H_2$, as the reaction gases, and argon Ar as inert gas were used as above described.

First, two wafers were prepared. In the respective wafers, an insulating film of $SiO_2$ is deposited on a substrate of Si, and a via hole or contact hole is made in the insulating film. The substrate surface is exposed in the via hole or contact hole.

Tungsten hexafluoride $WF_6$ and Argon Ar were used as reaction gas and inert gas, respectively. The first metallic film of W was formed to the depth of about a few hundreds of angstroms Å in the via hole or contact hole, at the growth temperature of 400° C. under the total pressure of about 0.7 Torr. One of the two wafers was taken out from the reaction chamber. The cross section was observed by an scanning electron microscope with respect to the formation of the encroachment.

Then, $WF_6$ and $H_2$ as the reaction gases and Ar as the inert gas were introduced into the reaction chamber. The second film of W was formed on the first film of W in the remaining wafer under the same conditions as above described. Similarly, the cross section after the formation of the second film was observed by the scanning electron microscope with respect to the development of the encroachment.

The same experiment as described above was made for the case that the inert gas was not used. As the result, it was confirmed that the development of the encroachment on the formation of the second film was further less in the case of using the inert gas flow Q, than in the case of using no inert gas flow Q. Further from the film formation experiments under the widely different conditions, it was confirmed that the suppressing effect on the encroachment by the above-described laminarization functions as an independent parameter of the growth temperature and pressure.

In the above embodiment, $H_2$ and $WF_6$ are used respectively for the reduction gas and the gas containing metallic element. However, this invention is not limited to them. For example, $MoF_6$, $TaF_5$, $CrF_4$, $TiF_4$, $TiCl_4$, $MoCl_5$, $WCl_6$, $AlCl_3$ etc. may be used for the gas containing metallic element. Further in the above embodiment, $SiO_2$ is used for the insulating film 9. However, this invention is not limited to it. For example, oxide such as $Al_2O_3$, BSG (Borosilicate glass), PSG (Phosphosilicate glass) and BPSG (Borophosphosilicate glass), nitride such as BN and or some chemical compound such as $SiN_xO_y$ may be used for the insulating film.

Further in the above embodiment, the first metallic films are made of W. This invention is not limited to it. For example, the first metallic films may be made of a different metal such as Mo, Ta, Cr, Ti, Al, Pt, Pd, Au, Ni or alloy of two or more of them or alloy of W.

Further, the first metallic films may be made of metal silicide such as silicide of W, Ti, Ta, Mo, or Pt, or metal nitride such as TiN.

Further in the above embodiment, the second metallic films are made of W. This invention is not limited to it. For example, the second metallic films may be made of a different metal such as Mo, Ta, Cr, Ti, Al, or alloy of two or more of them or alloy of W.

Or the metal element of the first metallic film may be both the same as that of the second metallic film, and may be different from that of the latter.

Further in the above embodiment, the substrate 3a is made of Si. This invention is not limited to it. For example, it may be made of $SiO_2$, $Al_2O_3$, glass or sapphire.

Further in the above embodiment, the maximum intensity of the infrared lamp 8 is obtained at the wave length of 1.1 to 3 $\mu$m. This invention is not limited to that range. An infrared lamp exhibiting the maximum intensity of the ray components at the wave length of 0.75 to 5 $\mu$m may be used.

Figure 9:
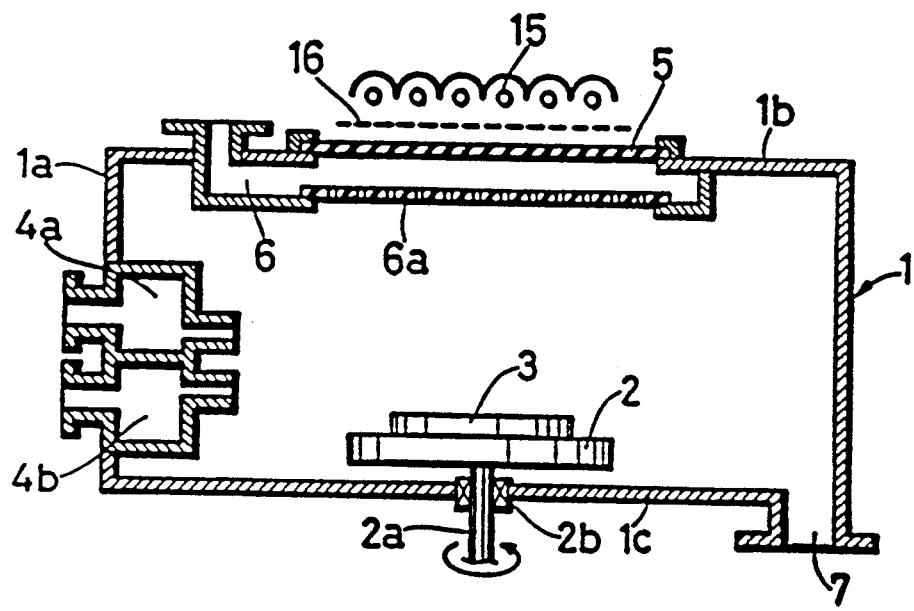
FIG. 9 is a schematic cross-sectional view of a CVD apparatus according to a second embodiment of this invention.

FIG. 9 shows a CVD apparatus according to a second embodiment of this invention. Parts in FIG. 9 which correspond to those in FIG. 5, are denoted by the same reference numerals.

Referring to FIG. 9, a heating lamp 15 is used. An optical filter 16 is interposed between the heating lamp 15 and the transparent quartz glass plate 5. Light components passing through the optical filter 16 from the heating lamp 15 exhibit the maximum intensity at the wave length of 0.75 to 5 $\mu$m. The same operation as described in the first embodiment is performed for the wafer 3, and the same effects can be obtained for the wafer 3.

Figure 10:
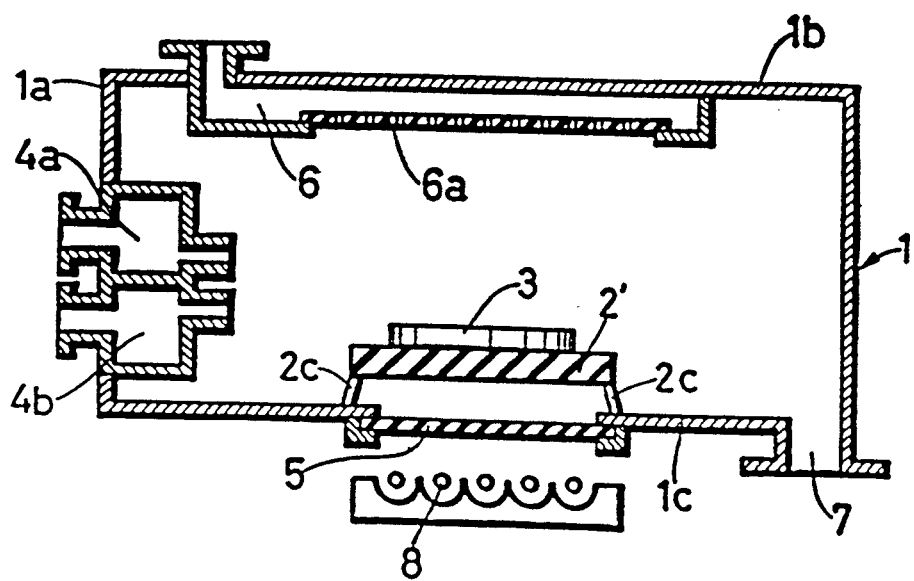
FIG. 10 is a schematic cross-sectional view of a CVD apparatus according to a third embodiment of this invention.

FIG. 10 shows a CVD apparatus according to a third embodiment of this invention. Parts in FIG. 10 which correspond to those in FIG. 5, are denoted by the same reference numerals.

Referring to FIG. 10, the infrared lamp 8 is arranged under a wafer holder 2' which is made of transparent quartz glass. The transparent quartz glass plate 5 is fixed to the bottom wall 1c in contrast to the first embodiment of FIG. 5. The wafer holder 2' is fixed to the bottom wall 1c by support members 2c. The same operations as described in the first embodiment are performed for the wafer 3, and the same effects can be obtained for the wafer 3.

Figure 11:
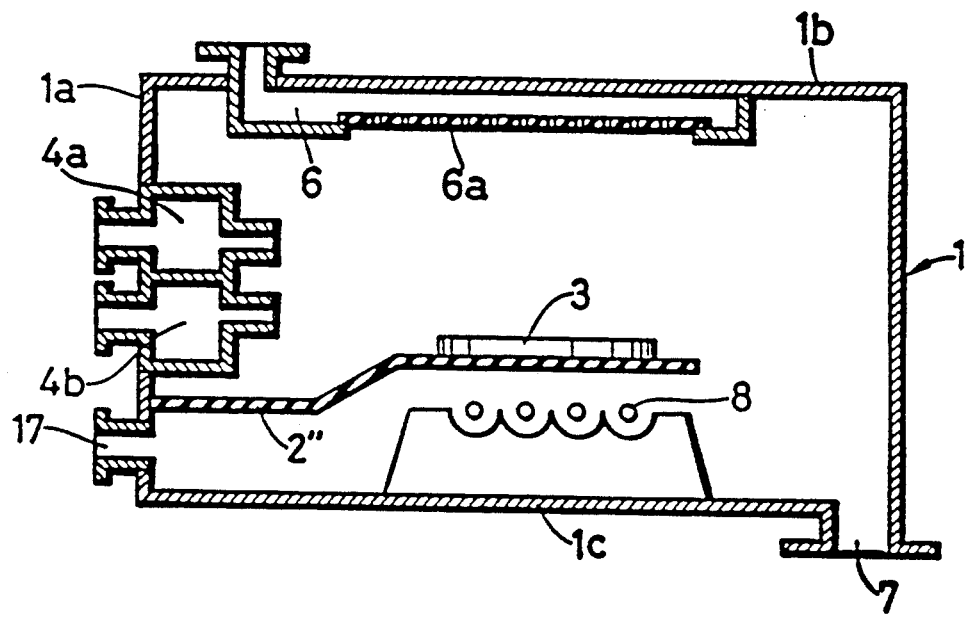
FIG. 11 is a schematic cross-sectional view of a CVD apparatus according to a fourth embodiment of this invention.

FIG. 11 shows a CVD apparatus according to a fourth embodiment of this invention. Parts in FIG. 11 which correspond to those in FIG. 5, are denoted by the same reference numerals.

Referring to FIG. 11, the infrared lamp 8 is arranged under a wafer holder 2" inside of the reaction chamber 1. The wafer holder 2" is made of transparent quartz glass plate, and it is fixed to the side wall 1a of the reaction chamber 1. Further, an inert gas introducing inlet 17 is made in the side wall 1a of the reaction chamber 1. The inert gas from the inlet 17 flows through the space between the wafer holder 2" and the infrared lamp 8, and it is discharged from the outlet 7. The reaction products are prevented from adhering onto the infrared lamp 8 and the wafer holder 2", by the flow of the inert gas from the inlet 17. The same operations as described in the first embodiment are performed for the wafer 3, and the same effects can be obtained for the wafer 3.

Figure 12:
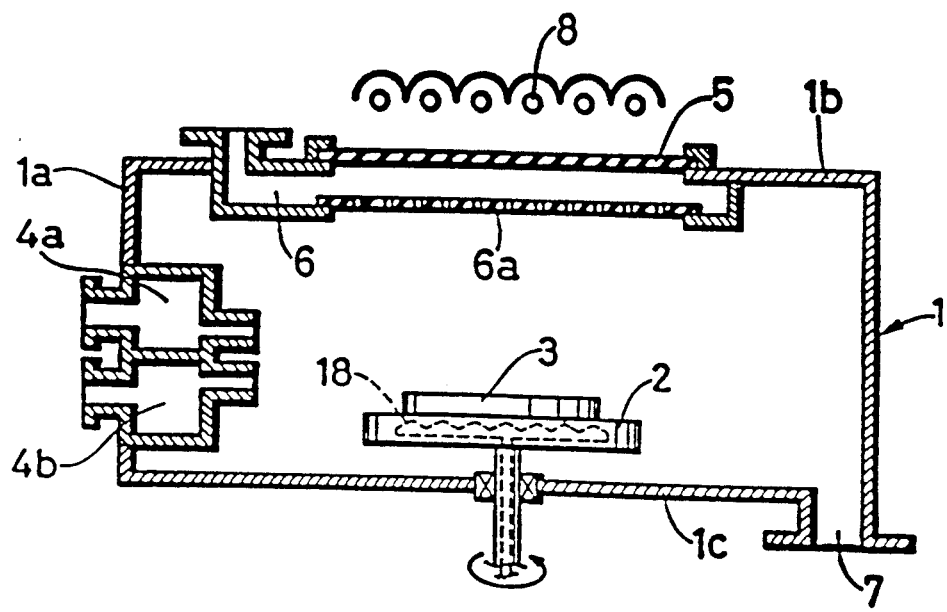
FIG. 12 is a schematic cross-sectional view of a CVD apparatus according to a fifth embodiment of this invention.

FIG. 12 shows a CVD apparatus according to a fifth embodiment of this invention. Parts in FIG. 12 which correspond to those in FIG. 5, are denoted by the same reference numerals.

Referring to FIG. 12 the wafer holder 2 is provided with a heater 18. The wafer 3 is heated also by the heater 18.

The same operations as described in the first embodiment are performed for the wafer 3, and the same effects can be obtained for the wafer 3.

In the above embodiments, the heating lamp or infrared lamp is used. Hereafter, the embodiments without the lamp will be described, also by which a wafer with high quality can be obtained, particularly with respect to the encroachment and voids.

Figure 13:
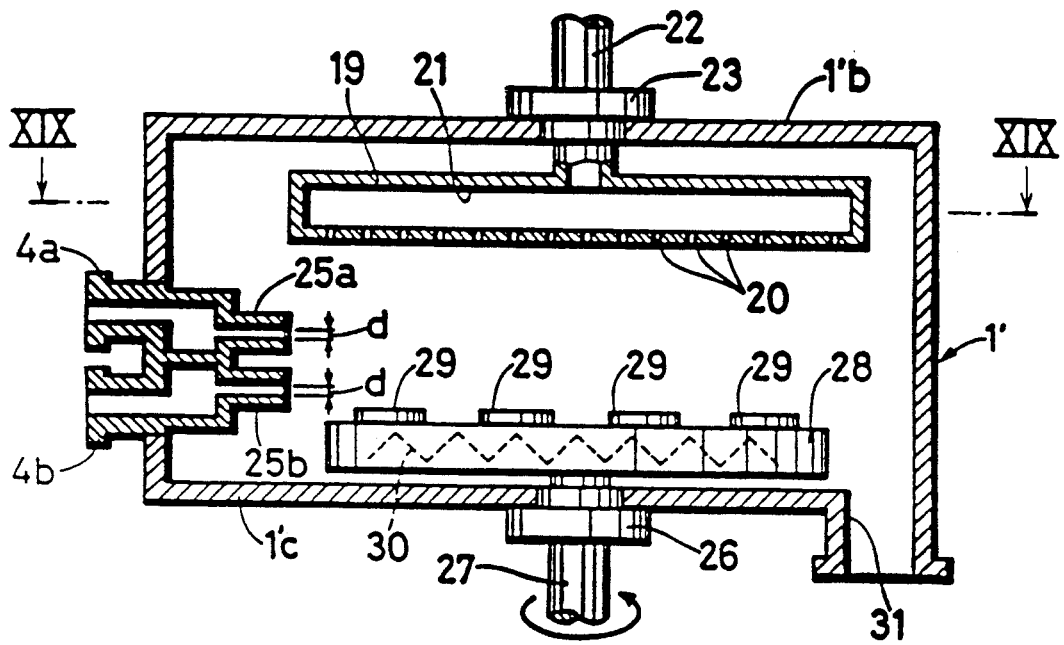
FIG. 13 is a schematic cross-sectional view of a CVD apparatus according to a sixth embodiment of this invention.
Figure 14:
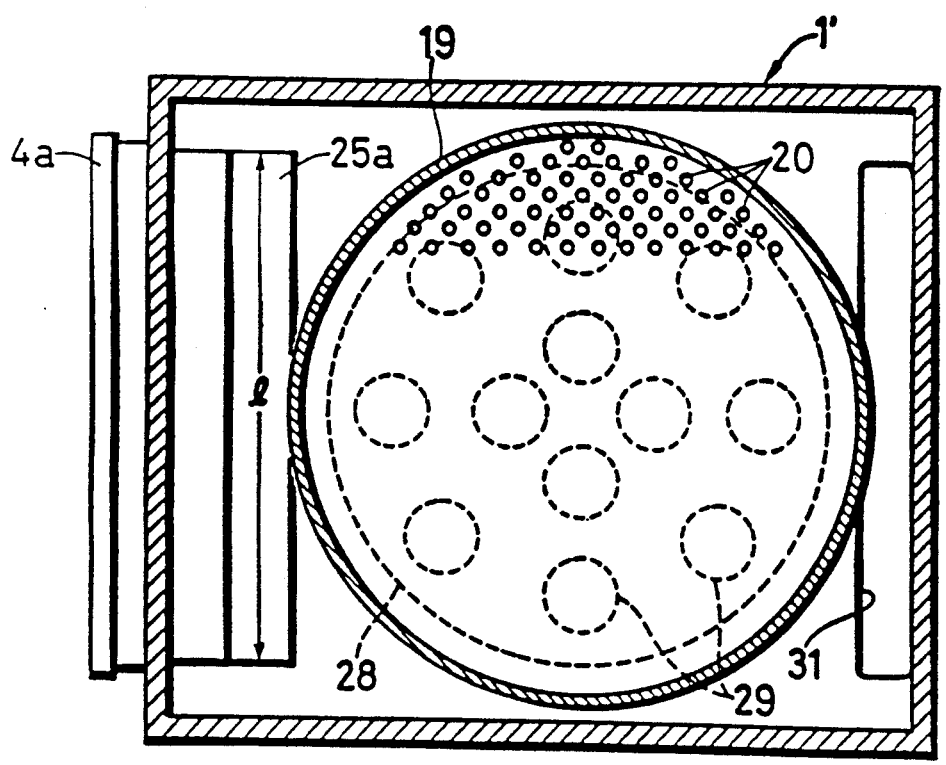
FIG. 14 is a cross-sectional view taken along the line XIX—XIX in FIG. 13.

FIG. 13 and FIG. 14 show a CVD apparatus according to a sixth embodiment of this invention. Parts in FIG. 13 which correspond to those in FIG. 5, are denoted by the same reference numerals. The gas introducing portions 4a and 4b will be described in more detail in this embodiment, although they have the same constructions as in FIG. 5.

The gas introducing portions 4a and 4b have nozzle portions 25a and 25b with slit-like openings. Under the levels of the nozzle portions 25a and 25b, a circular wafer holder 28 is rotatably arranged in a reaction chamber 1'. A rotary shaft 27 passing in fluidtight condition through a seal member 26 is fixed to the center of the wafer holder 28. The wafer holder 28 is rotated at a predetermined speed. The wafer holder 2 in the first embodiment is similarly rotated. A discharge outlet 31 is formed in the bottom wall 1'C of the reaction chamber 1'.

The wafer holder 28 contains a heater 30. Plural wafers 29 are mounted on the wafer holder 28, and they are heated with the heater 30. The wafers 29 have the same construction as the wafer 3 described in the first embodiment, as shown in FIG. 6A or FIG. 6B.

An inert gas spouting plate 19 is arranged directly above the wafer holder 28, and it has a hollow portion 21. A pipe 22 passes in fluidtight condition through a seal member 23 fixed to the upper wall 1'b of the reaction chamber 1', and it communicates with the hollow portion 21. An inert gas such as Ar is supplied into the pipe 22. Numerous small openings 20 are made in the inert gas spouting plate 19, through which the inert gas is spouted downwards.

The nozzle portions 25a and 25b extend substantially in parallel with the upper surface of the wafer holder 28. Also the slit-like openings thereof extend substantially in parallel with the upper surface of the wafer holder 28.

The width d of the nozzle portions 25a and 25b is sufficiently small in comparison with the length l of the slit-like openings thereof. The reaction gases are spouted from the nozzle openings at the flow rate corresponding to the Reynolds number of larger than 10 (ten). The distance between the level of the nozzle portions 25a and 25b and the surface of the wafer holder 28 is so designed as to be nearly equal to 40% of the distance between the inert gas spouting plate 19 and the upper surface of the wafer holder 28. Although the width d of the nozzle portions 25a and 25b are very small, it is exaggerated in the drawings. The nozzle portions 25a and 25b may be made one common nozzle portion, and the mixing gas of the reaction gases $H_2$ and $WF_6$ may be spouted from the one common nozzle portion.

In the operation, the inert gas is spouted downwards from the inert gas spouting plate 19, and the reaction gases are spouted horizontally from the nozzle portions 25a and 25b. The gas flow effect described in the first embodiment, as shown in FIG. 8A to FIG. 8C, can be obtained also in this embodiment. The second metallic film is deposited on the first metallic film with good quality, particularly with respect to the encroachment and void.

Figure 15:
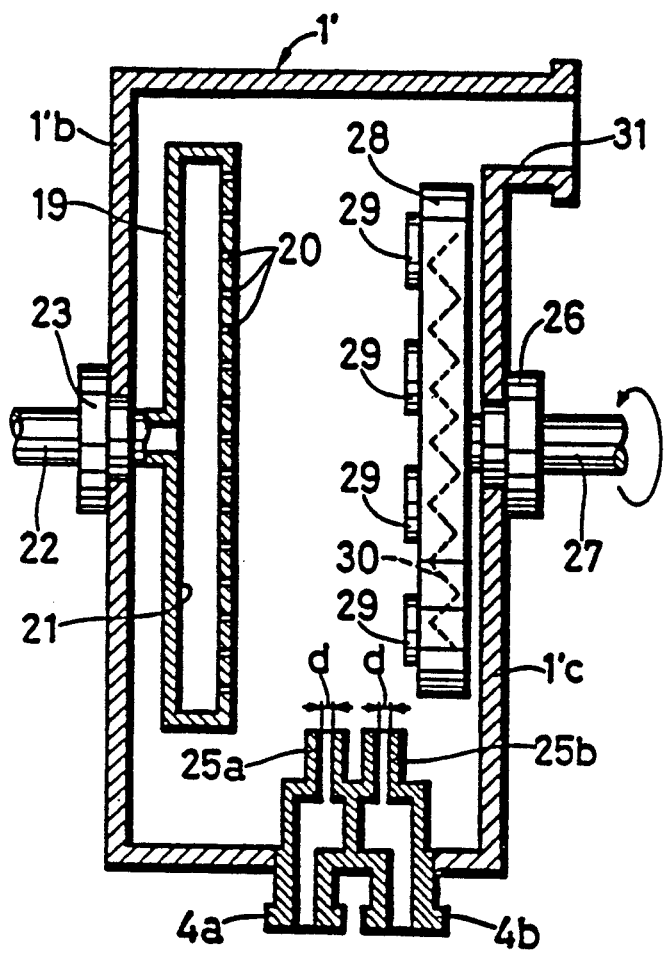
FIG. 15 is a cross-sectional view of a CVD apparatus according to a seventh embodiment of this invention.

FIG. 15 shows a seventh embodiment. Parts in FIG. 15 which correspond to those in FIG. 13, are denoted by the same reference numerals. The whole reaction chamber 1' of this embodiment is angularly displaced by 90 degrees in comparison with that of the seventh embodiment.

While the preferred embodiments have been described, variations thereto will occur to those skilled in the art within the scope of the present inventive concepts which are delineated by the following claims.

Figure 16:
FIG. 16 is a front view of one modification of gas introducing portions in FIG. 5.
Figure 17:
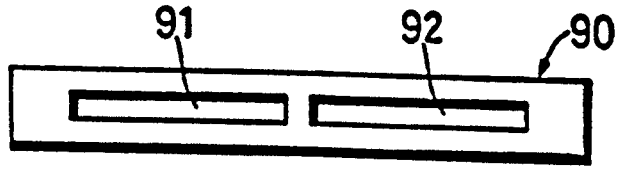
FIG. 17 is a front view of another modification of the gas introducing portions in FIG. 5.

For example, in the above embodiments, the gas introducing portions 4a and 4b have slit-like openings, respectively. Instead, a flat hollow pipe 80 as shown in FIG. 16 may be used. Numerous small openings 81 are made in the front wall. Mixed gas of $WF_6$ and $H_2$ is spouted from the openings 81. Or a flat hollow pipe 90 as shown in FIG. 17 may be used. Two slits 91 and 91 are made in horizontal line, in the front wall.

Further in the above embodiment of FIG. 5 the plate having numerous small openings is used for the inert gas spouting plate 6a. Instead, a transparent strainer with suitable aspect ratio or a transparent honey-comb may be used.

Further in the above embodiments, inert gas is used as the gas flow towards the surface of the wafer. Instead, an inert gas containing partially reactive gas may be used. In that case, it is necessary that the reactive gas does not make dust particles. For example, the reactive gas may be $H_2$ or $O_2$.

What is claimed is:

1. A CVD (Chemical Vapor Deposition) method for selectively depositing metal on a substrate comprising the steps of:
   (A) holding a wafer on a wafer holder in a reaction chamber to be put under a reduced pressure; at least one via hole or contact hole being made in an insulating film formed on a substrate of said wafer and a first metallic film being formed in said via hole or contact hole; and
   (B) introducing a gas containing a metallic element and a reduction gas into said reaction chamber under the reduced pressure and directing light of a heating lamp onto said wafer so that some temperature difference is made between said insulating film and said first metallic film, utilizing some difference of absorption ratios of infrared components of said light among said insulating film, said substrate, and said first metallic film such that a chemical reaction is effected only on said first metallic film whereby a second metallic film of said metallic element is formed only on said first metallic film and said insulating film and said substrate are unaffected by said introduced gas containing said metallic element and said reduction gas.

2. A CVD method for selectively depositing metal on a substrate according to claim 1, in which the metal element of said first metallic film is the same as that of the second metallic film.

3. A CVD method for selectively depositing metal on a substrate according to claim 1, in which the metal element of the first metallic film is different from that of the second metallic film.

4. A CVD method for selectively depositing metal on a substrate according to claim 1, in which said reduction is $H_2$, and said gas containing metallic element as a constituent is one or more of $WF_6$, $MoF_6$, $TaF_5$, $CrF_4$, $TiF_4$, $TiCl_4$, $MoCl_5$, $WCl_6$ and $AlCl_3$.

5. A CVD method for selectively depositing metal on a substrate according to claim 1, in which said insulating film is one or more of $SiO_2$, $Al_2O_3$, BSG, PSG, BPSG (Oxides), BN (nitride) and silicon oxynitride.

6. A CVD method for selectively depositing metal on a substrate according to claim 1, in which said first metallic film is one or more of W, Mo, Ta, Cr, Ti, Al, Pt, Pd, Au, Ni (metals) and alloys consisting of two or more of them.

7. A CVD method for selectively depositing metal on a substrate according to claim 1, in which said first metallic film is metal silicide or TiN (metal nitride).

8. A CVD method for selectively depositing metal on a substrate according to claim 1, in which said substrate of the wafer is made of Si, $SiO_2$, $Al_2O_3$, glass, or sapphire.

9. A CVD method for selectively depositing metal on a substrate according to claim 1, in which said heating lamp is an infrared lamp.

10. A CVD method for selectively depositing metal on a substrate according to claim 9, in which light components of wave length 0.75 to 5 $\mu$m are most intensive in the light of said infrared lamp.

11. A CVD method for selectively depositing metal on a substrate according to claim 1, in which an optical filter means is interposed between said heating lamp and said wafer so that light components having a wave length of 0.75 to 5 $\mu$m are the most intensive in the light directed onto said wafer.

12. A CVD method for selectively depositing metal on a substrate according to claim 1, in which said method further comprises the step of directing an inert gas or a gas containing mainly inert gas towards said wafer, and said gas containing metallic element and said reduction gas are introduced in flat or sheet form substantially parallel to the surface of the wafer.

13. A CVD method for selectively depositing metal on a substrate according to claim 1, in which said wafer holder is rotated.

14. A CVD method for selectively depositing metal on a substrate according to claim 1, in which said wafer holder is transparent, and the light of said heating lamp passes through said wafer holder onto said wafer.

15. A CVD method for selectively depositing metal on a substrate according to claim 14, in which an inert gas is directed between said heating lamp and said wafer holder.

16. A CVD method for selectively depositing metal on a substrate comprising the steps of:
  (A) holding a wafer on a wafer holder in a reaction chamber to be put under a reduced pressure, at least one via hole or contact hole being made in an insulating film formed on a substrate of said wafer and a first metallic film being formed in said via hole or contact hole; and
  (B) introducing a gas containing a metallic element and a reduction gas in flat or sheet form substantially parallel to the surface of said wafer into said reaction chamber under the reduced pressure, introducing an inert gas or a second gas containing mainly inert gas towards the surface of said wafer and heating said wafer whereby a second metallic film of said metal element is formed on said first metallic film.

17. A CVD method for selectively depositing metal on a substrate according to claim 16, in which the metal element of said first metallic film is the same as that of said second metallic film.

18. A CVD method for selectively depositing metal on a substrate according to claim 16, in which the metal element of said first metallic film is different from that of said second metallic film.

19. A CVD method for selectively depositing metal on a substrate according to claim 16, in which said reduction gas is $H_2$, and said gas containing a metallic element as a constituent is one or more of $WF_6$, $MoF_6$, $TaF_5$, $CrF_4$, $TiF_4$, $TiCl_4$, $MoCl_5$, $WCl_6$, and $AlCl_3$.

20. A CVD method for selectively depositing metal on a substrate according to claim 16, in which said insulating film is one or more of $SiO_2$, $Al_2O_3$, BSG, PSG, BPSG (Oxides), BN (nitride) and oxynitride.

21. A CVD method for selectively depositing metal on a substrate according to claim 16, in which said first metallic film is one or more of W, Mo, Ta, Cr, Ti, Al, Pt, Pd, Au, Ni (metals) and alloys consisting of two or more of them.

22. A CVD method for selectively depositing metal on a substrate according to claim 16, in which said first metallic film is metal silicide or TiN (metal nitride).

23. A CVD method for selectively depositing metal on a substrate according to claim 16, in which said substrate of the wafer is made of Si, $SiO_2$, $Al_2O_3$, glass or sapphire.

24. A CVD method for selectively depositing metal on a substrate according to claim 16, in which said wafer holder is rotated.

* * * * *

UNITED STATES PATENT AND TRADEMARK OFFICE
CERTIFICATE OF CORRECTION

PATENT NO. : 4,994,301
DATED : February 19, 1991
INVENTOR(S) : Yoshiro Kusumoto et al.

It is certified that error appears in the above—identified patent and that said Letters Patent is hereby corrected as shown below:

Title page:

Item (54) and col. 1, lines 1-5 "ACVD" should read --A CVD--.

In The Abstract:

Line 4, "in" (1st. Occ.) should be --on--.
Line 12, "adsorption" should be --absorption--.

In The Specification:

Column 1, line 8, "Vapour" should be --Vapor--.
Column 1, line 63, "ar" should be --are--.
Column 2, line 68, "Vapour" should be --Vapor--.
Column 3, lines 35 and 36, "understand" should be --understood--
Column 7, line 49, "an" should be --a--.
Column 10, line 42, second occurrence of "91" should be --92--.

Signed and Sealed this

Twelfth Day of January, 1993

Attest:

DOUGLAS B. COMER

*Attesting Officer*   Acting Commissioner of Patents and Trademarks